(12) United States Patent
Jadhav et al.

(10) Patent No.: US 7,164,585 B2
(45) Date of Patent: Jan. 16, 2007

(54) THERMAL INTERFACE APPARATUS, SYSTEMS, AND METHODS

(75) Inventors: Susheel G. Jadhav, Chandler, AZ (US); Carl Deppisch, Phoenix, AZ (US); Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/404,223

(22) Filed: Mar. 31, 2003

(65) Prior Publication Data

US 2004/0190263 A1   Sep. 30, 2004

(51) Int. Cl.
*H05K 7/20*   (2006.01)
*H01R 43/00*  (2006.01)

(52) U.S. Cl. .................. 361/705; 29/825; 165/80.2; 165/185; 257/707; 257/713

(58) Field of Classification Search ............ 165/80.2, 165/185, 80.3; 174/16.3, 260; 257/706–707, 257/712–713; 361/687–688, 704–722; 428/620–621, 428/641–642, 646, 647; 228/56.3, 186.22; 438/614
See application file for complete search history.

(56) References Cited

U.S. PATENT DOCUMENTS

| | | | |
|---|---|---|---|
| 2,986,678 A * | 5/1961 | Andres et al. ............. 257/708 |
| 3,860,949 A * | 1/1975 | Stoeckert et al. .......... 257/708 |
| 4,034,468 A * | 7/1977 | Koopman ................... 29/825 |
| 4,480,261 A | 10/1984 | Hattori et al. ............. 257/753 |
| 4,929,516 A | 5/1990 | Pryor et al. ................ 428/620 |
| 5,153,706 A | 10/1992 | Baba et al. ................ 257/676 |
| 5,263,245 A * | 11/1993 | Patel et al. ................ 29/840 |
| 5,480,835 A * | 1/1996 | Carney et al. ............. 438/614 |
| 6,091,603 A | 7/2000 | Daves et al. ............... 361/704 |
| 6,313,412 B1 * | 11/2001 | Trumble et al. ........... 174/260 |
| 6,531,770 B1 * | 3/2003 | Nakashima ................ 257/704 |

FOREIGN PATENT DOCUMENTS

| | | |
|---|---|---|
| TW | 431931 | 5/2001 |
| TW | 472513 | 1/2002 |
| WO | WO-04095574 A1 | 11/2004 |

\* cited by examiner

*Primary Examiner*—Gregoty D. Thompson
(74) *Attorney, Agent, or Firm*—Schwegman, Lundberg, Woessner & Kluth, P.A.

(57) ABSTRACT

An apparatus and system, as well as fabrication methods therefor, may include a die having a surface and a primary material comprising tin, pure tin, or substantially pure tin coupled to the surface. A heat dissipating element may be coupled to the primary material.

17 Claims, 2 Drawing Sheets

THERMAL INTERFACE APPARATUS, SYSTEMS, AND METHODS

TECHNICAL FIELD

The subject matter relates generally to compositions, apparatus, systems, and method used to assist in transferring heat from one element or body, such as a circuit, to another, such as a heat sink.

BACKGROUND INFORMATION

Electronic components, such as integrated circuits, may be assembled into component packages by physically and electrically coupling them to a substrate. During operation, the package may generate heat that can be dissipated to help maintain the circuitry at a desired temperature. Heat sinks, heat spreaders, and other heat dissipating elements may be attached to the package using a suitable thermal interface material to assist in this type of operation.

The interface material, which may be Indium solder, can be used to attach a copper heat spreader to a die, for example. However, the process of attaching the heat spreader to the die typically includes coating at least one surface of each component with gold and/or other materials, which is expensive. Thus, there is a significant need in the art for finding other interface materials that reduce the need for expensive coatings.

DETAILED DESCRIPTION

Figure 1:
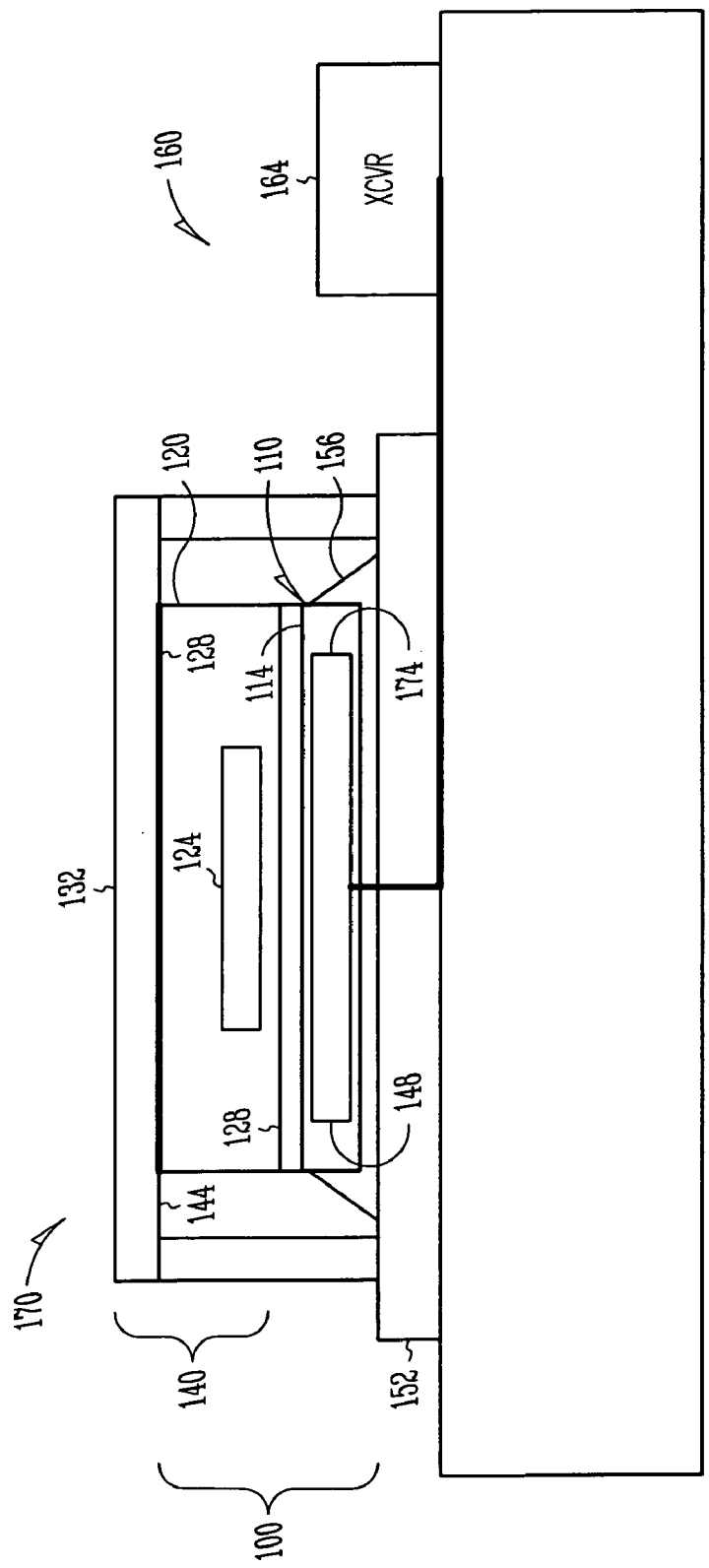
FIG. 1 is a side cut-away view of apparatus and systems according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense.

FIG. 1 is a side cut-away view of apparatus 100, 140 and systems 160, 170 according to various embodiments. For example, an apparatus 100 may comprise a die 110 having a surface 114, and a primary material 120 comprising tin coupled to the surface 114. The die 110 may comprises silicon and/or other materials.

Several embodiments exist with respect to the composition of the primary material 120. For example, the primary material 120 may include one or more secondary materials 124, such as any one or more of the materials selected from the group including bismuth, copper, gallium, indium, zinc, antimony, magnesium, lead, and silver (e.g., also included are alloys of these materials, such as copper-silver or bismuth-copper-silver). Such secondary materials 124 may form no more than about 49% by weight of the primary material. Therefore, as used herein, the term "tin-based alloy" is defined to mean a primary material 120 that includes at least about 51% tin by weight, and no more than about 49% by weight of one or more secondary materials 124.

Alternatively, or in addition, the primary material 120 may comprise "substantially pure tin", which is defined herein to mean that tin forms at least about 97% by weight of the primary material 120. Similarly, the primary material 120 may comprise "pure tin", which is defined herein to mean that tin forms at least about 99% by weight of the primary material 120. The apparatus 100 may also have a coating 128 comprising nickel adjacent the surface 114 and/or the surface 144.

A heat dissipating element 132, such as a heat sink or a heat spreader, can be coupled to the primary material 120. The heat dissipating element 132 may comprise copper or copper coated with nickel.

By fabricating such an apparatus 100, two advantages may accrue. First, the use of pure tin, substantially pure tin, and/or tin-based alloys to couple the die 110 to a heat dissipating element 132, such as a copper heat spreader, enables forming a metallurgical bond directly with the surface 144 of the copper material, without pre-coating the copper with gold, for example. Second, the use of pure tin, substantially pure tin, and/or tin-based alloys also enables proper wetting of a nickel-coated die surface 114 without the use of an adjacent gold coating. Fabrication expenses may thus be substantially reduced.

In some embodiments, it may be desirable that the tin comprises a sufficient amount by weight of the primary material 120 so that the primary material 120 has an ultimate tensile strength of less than about 20 MPa (and preferably, less than about 10 MPa) and an elongation (i.e., the extent of plastic deformation that a material can sustain before it breaks) of greater than about 15% (and preferably, greater than about 30%). Alternatively, or in addition, it may be desirable that tin comprises a sufficient amount by weight of the primary material 120 so that the primary material 120 has sufficient thermal conductivity to effectively carry the heat away from the die.

The phrase "sufficient amount" as used herein identifies an amount of tin sufficient to obtain the desired performance from the primary material 120, e.g., obtaining a desired or targeted thermal resistance value of less than about 0.2 $^{\circ}Ccm^2/W$. Use of pure tin, substantially pure tin, and/or tin-based alloys in this manner also helps reduce the coefficient of thermal expansion (CTE) mismatch between the primary material 120, the heat spreader 132, and die 110, which may lessen stress generated during reflow operations (see references to block 245, FIG. 2, below). The amount of tin in the primary material 120 may also be selected so as to be an amount that provides a selected amount of solderjoint or coupling reliability degradation during thermal cycling, which may depend on the quality and reliability testing requirements for a particular electronic package.

Other embodiments may also be realized. For example, as shown in FIG. 1, some embodiments include an apparatus 140 comprising a heat dissipating element 132 having a surface 144 comprising copper or copper coated with nickel and a primary material 120 comprising tin coupled to the surface 144. As noted previously, the primary material 120 may comprise one or more secondary materials 124, wherein the secondary materials 124 can include any one or more of the materials selected from the group including bismuth, copper, gallium, indium, zinc, antimony, magnesium, lead, and silver (e.g., also included are alloys of these materials, such as copper-silver or bismuth-copper-silver). The primary material may also comprise substantially pure tin.

The heat dissipating element 132 may comprise any number of devices, including a heat sink, a peltier cooler, and/or a heat spreader. The die 110 may comprise any kind or amount of circuitry 148 and/or components, including a flip-chip, a processor, one or more power transistors, and/or a memory. The die 110 may be coupled to a substrate 152 using an underfill material 156. The substrate 152 may comprise organic or inorganic materials, or combinations of these. The substrate 152 may also comprise flexible materials and/or nonflexible materials. Materials included in the substrate 152 may be non-conductive or conductive, depending upon the configuration and requirements of the apparatus 100, 140. Still other embodiments may be realized. For example, as shown in FIG. 1, a system 160 may comprise a wireless transceiver 164, a die 110, and a primary material 120. The die 110 may include a circuit 148 electrically coupled to the wireless transceiver 164. The primary material 120 may comprise tin, pure tin, or substantially pure tin, coupled to a surface 114 of the die 110. The primary material 120 may also comprise a secondary material 124, such as any one or more of the materials selected from the group including bismuth, copper, gallium, indium, zinc, antimony, magnesium, lead, and silver (e.g., also included are alloys of these materials, such as copper-silver and bismuth-copper-silver).

The system 160 may have a coating 128 comprising nickel adjacent the surface 114 and/or the surface 144. The system 160 may also include a heat dissipating element 132 coupled to the primary material 120.

Still further embodiments may be realized. For example, as shown in FIG. 1, a system 170 may comprise a die 110 including a power transistor 174, a heat dissipating element 132, and a primary material 120 coupled to a surface 114 of the die 110 and a surface 144 of the heat dissipating element 132. The surface 144 of the heat dissipating element 132 may comprise copper or copper coated with nickel. The primary material 120 may comprise tin, pure tin, or substantially pure tin. The primary material 120 may further comprise a secondary material 124, such as any one or more of the materials selected from the group including bismuth, copper, gallium, indium, zinc, antimony, magnesium, lead, and silver (e.g., also included are alloys of these materials, such as copper-silver and bismuth-copper-silver). The system 170 may further include a coating 128 comprising nickel adjacent the surface 114 and/or the surface 144.

It should be noted that the primary material 120 and the secondary material 124 are shown as discrete components in FIG. 1. This method of illustration is used so as not to obscure the makeup of the primary material 120, but is not meant to limit the use, appearance, form, or combinational mechanisms of the primary and secondary materials 120, 124 in any way. Thus, for example, the primary and secondary materials 120, 124 may be physically adjacent to each other and separable, so as to be readily distinguishable from each other. It is also possible that the materials 120, 124 are so combined with each other and/or other components of the primary material 120 as to be physically indistinguishable from each other and/or the other components within the primary material 120 (e.g., a chemical analysis, rather than a microscopic examination of the primary material 120 may be required to determine the presence of the secondary material 124, or other materials within the primary material 120). Finally, it may also be the case that the materials 120, 124 are so combined or bonded with each other and/or other components of the primary material 120 as to be chemically indistinguishable from each other and/or the other components within the primary material 120 after the primary material 120 is formed.

It should also be understood that the apparatus and systems of various embodiments can be used in applications other than for coupling and heat transfer between dice and heat dissipating elements, and thus, the embodiments shown are not to be so limited. The illustrations of apparatus 100, 140, and systems 160, 170 are intended to provide a general understanding of the elements and structure of various embodiments, and they are not intended to serve as a complete description of all the features of compositions, apparatus, and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 2:
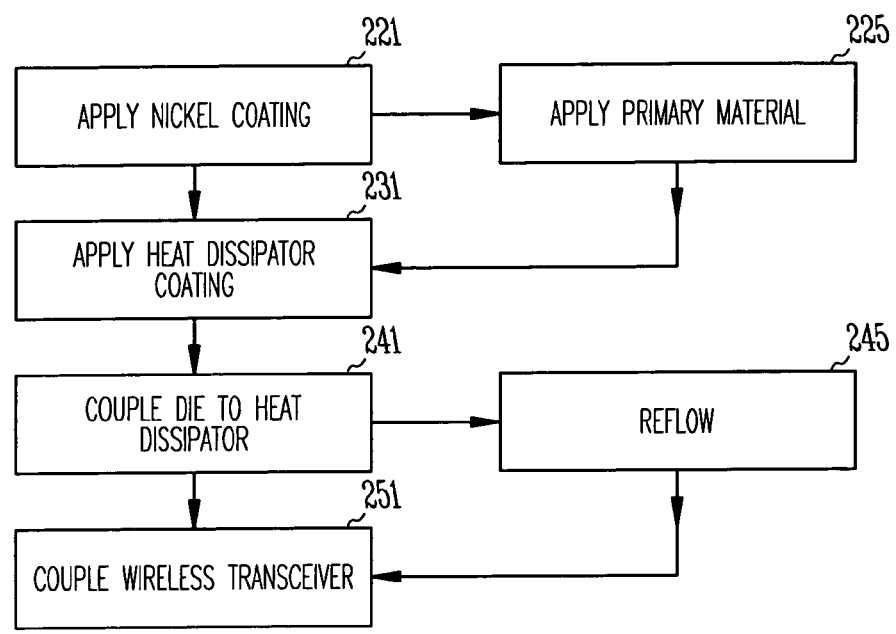
FIG. 2 is a flow chart illustrating several methods according to various embodiments.

Some embodiments include a number of methods. For example, FIG. 2 is a flow chart illustrating several methods 211 according to various embodiments. Thus, a method 211 may (optionally) begin with applying a coating comprising nickel to the surface of a die at block 221. The method may also include applying a coating of the primary material to the surface of the die at block 225. The method may continue with applying a coating of the primary material to the surface of the heat dissipating element at block 231. As noted previously, the primary material may include tin, pure tin, or substantially pure tin, as well as a secondary material, such as any one or more of the materials selected from the group including bismuth, copper, gallium, indium, zinc, antimony, magnesium, lead, and silver (e.g., also included are alloys of these materials, such as copper-silver and bismuth-copper-silver).

The method 211 may include coupling a surface of the die to a surface of a heat dissipating element, such as by using the primary material comprising tin, pure tin, or substantially pure tin, at block 241. Coupling the surface of the die to the surface of the heat dissipating element at block 241 may further comprise reflowing the primary material at block 245. The heat dissipating element may comprise a copper heat spreader, a heat sink, and/or a peltier cooler.

The die may comprise a circuit including a power transistor. Thus, the method 211 may also include coupling a wireless transceiver to a circuit included in the die at block 251.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
   a die consisting of a semiconductor, the die including a surface; and
   a primary material comprising at least 97% tin coupled directly to the surface of the die wherein the primary material further comprises a secondary material selected from the group of bismuth, copper, gallium, indium, zinc, antimony, magnesium, lead, silver, and alloys thereof.

2. The apparatus of claim 1, further comprising:
   a heat dissipating element coupled to the primary material.

3. The apparatus of claim 2, wherein the heat dissipating element comprises copper.

4. The apparatus of claim 1, wherein the semiconductor comprises silicon.

5. An apparatus, comprising:
   a heat dissipating element having a surface comprising copper and a nickel coating; and
   a primary material comprising at least 97% tin coupled to the surface, wherein the primary material further comprises a secondary material selected from the group consisting of bismuth, gallium, zinc, antimony. magnesium, silver, and alloys thereof.

6. The apparatus of claim 5, wherein the heat dissipating element comprises a heat sink.

7. The apparatus of claim 5, wherein the heat dissipating element comprises a heat spreader.

8. A system, comprising:
   a wireless transceiver;
   a die consisting of a semiconductor, the die including a surface and a circuit electrically coupled to the wireless transceiver; and
   a primary material comprising at least 97% tin coupled directly to the surface of the die wherein the primary material further comprises a secondary material selected from the group of bismuth, copper, gallium, indium, zinc, antimony, magnesium, lead, silver, and alloys thereof.

9. The system of claim 8, further comprising:
   a heat dissipating element coupled to the primary material.

10. A system, comprising:
    a die consisting of a semiconductor, the die including a power transistor having a first surface;
    a heat dissipating element having a second surface comprising copper; and
    a primary material comprising at least 97% tin coupled directly to the first surface wherein the primary material further comprises a secondary material selected from the group of bismuth, copper, gallium, indium, zinc, antimony, magnesium, lead, silver, and alloys thereof.

11. A method, comprising:
    coupling a surface of a die consisting of a semiconductor directly to a surface of a heat dissipating element with a primary material comprising at least 97% tin wherein the primary material further comprises a secondary material selected from the group of bismuth, copper, gallium, indium, zinc, antimony, magnesium, lead, silver, and alloys thereof.

12. The method of claim 11, wherein coupling the surface of the die to the surface of the heat dissipating element further comprises:
    reflowing the primary material.

13. The method of claim 11, further comprising:
    applying the primary material to the surface of the die.

14. The method of claim 11, further comprising:
    applying the primary material to the surface of the heat dissipating element.

15. The method of claim 11, further comprising:
    coupling a wireless transceiver to a circuit included in the die.

16. The method of claim 11, wherein the die comprises a power transistor.

17. The method of claim 11, wherein the heat dissipating element comprises a copper heat spreader.

* * * * *

UNITED STATES PATENT AND TRADEMARK OFFICE
CERTIFICATE OF CORRECTION

PATENT NO. : 7,164,585 B2
APPLICATION NO. : 10/404223
DATED : January 16, 2007
INVENTOR(S) : Jadhav et al.

It is certified that error appears in the above-identified patent and that said Letters Patent is hereby corrected as shown below:

On Title Page, in "Primary Examiner", line 1, delete "Gregoty D. Thompson" and insert -- Gregory D. Thompson --, therefor.

In column 5, line 24, in Claim 1, after "a die" delete "consisting of a semiconductor, the die".

In column 5, line 26, in Claim 1, delete "97%" and insert -- 98% --, therefor.

In column 5, line 27, in Claim 1, before "to the" delete "directly".

In column 5, line 27, in Claim 1, after "die" insert -- with one of no coating material or only a coating of nickel --.

In column 5, line 37, in Claim 4, delete "semiconductor" and insert -- die --, therefor.

In column 5, line 42, in Claim 5, delete "97%" and insert -- 98% --, therefor.

In column 5, lines 43–46, in Claim 5, after "surface," delete "wherein the primary material further comprises a secondary material selected from the group consisting of bismuth, gallium, zinc, antimony, magnesium, silver, and alloys thereof." and insert -- . --, therefor.

In column 6, line 3, in Claim 8, after "a die" delete "consisting of a semiconductor, the die".

In column 6, line 6, in Claim 8, delete "97%" and insert -- 98% --, therefor.

In column 6, line 7, in Claim 8, before "to the" delete "directly".

In column 6, line 7, in Claim 8, after "die" insert -- with one of no coating material or only a coating of nickel --.

In column 6, line 16, in Claim 10, after "a die" delete "consisting of a semiconductor, the die".

In column 6, line 20, in Claim 10, delete "97%" and insert -- 98% --, therefor.

In column 6, line 21, in Claim 10, before "to the" delete "directly".

In column 6, line 21, in Claim 10, after "surface" insert -- with one of no coating material or only a coating of nickel, and the second surface --.

UNITED STATES PATENT AND TRADEMARK OFFICE
CERTIFICATE OF CORRECTION

PATENT NO. : 7,164,585 B2
APPLICATION NO. : 10/404223
DATED : January 16, 2007
INVENTOR(S) : Jadhav et al.

It is certified that error appears in the above-identified patent and that said Letters Patent is hereby corrected as shown below:

In column 6, lines 26–27, in Claim 11, after "a die" delete "consisting of a semiconductor directly".

In column 6, line 28, in Claim 11, delete "97%" and insert -- 98% --, therefor.

In column 6, line 28, in Claim 11, after "tin" insert -- with one of no coating material or only a coating of nickel on the surface of the die --.

In column 6, line 38, in Claim 13, after "applying" insert -- a coating of --.

In column 6, line 40, in Claim 14, after "applying" insert -- a coating of --.

Signed and Sealed this

Tenth Day of April, 2007

JON W. DUDAS
*Director of the United States Patent and Trademark Office*